United States Patent
Kronmueller et al.

(10) Patent No.: US 7,851,248 B2
(45) Date of Patent: Dec. 14, 2010

(54) METHOD FOR PRODUCING A MICROMECHANICAL COMPONENT HAVING A THIN-LAYER CAPPING

(75) Inventors: Silvia Kronmueller, Schwaikheim (DE); Tino Fuchs, Tuebingen (DE); Ando Feyh, Tamm (DE); Christina Leinenbach, Ensdorf (DE); Marco Lammer, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 18 days.

(21) Appl. No.: 12/305,150

(22) PCT Filed: Aug. 21, 2007

(86) PCT No.: PCT/EP2007/058684

§ 371 (c)(1),
(2), (4) Date: Jun. 1, 2009

(87) PCT Pub. No.: WO2008/046682

PCT Pub. Date: Apr. 24, 2008

(65) Prior Publication Data

US 2010/0003790 A1 Jan. 7, 2010

(30) Foreign Application Priority Data

Oct. 19, 2006 (DE) .................. 10 2006 049 259

(51) Int. Cl.
*H01L 21/00* (2006.01)
(52) U.S. Cl. .................. 438/53; 438/694; 438/706; 438/735; 257/E21.222
(58) Field of Classification Search ............ 438/53, 438/694, 706, 735; 257/E21.222; 911/840
See application file for complete search history.

(56) References Cited

U.S. PATENT DOCUMENTS

| | | | |
|---|---|---|---|
| 6,936,902 B2 | 8/2005 | Reichenbach et al. | |
| 2003/0141561 A1 | 7/2003 | Fischer et al. | |
| 2004/0245586 A1 | 12/2004 | Partridge et al. | |
| 2004/0248344 A1 | 12/2004 | Partridge et al. | |
| 2005/0204821 A1* | 9/2005 | Fischer et al. | 73/715 |
| 2005/0255710 A1* | 11/2005 | You et al. | 438/780 |
| 2008/0311751 A1* | 12/2008 | Laermer et al. | 438/694 |
| 2009/0026561 A1* | 1/2009 | Reichenbach et al. | 257/416 |

FOREIGN PATENT DOCUMENTS

| | | |
|---|---|---|
| DE | 19961578 | 6/2001 |
| DE | 10006035 | 8/2001 |
| DE | 102004036803 | 3/2006 |
| WO | WO 2006/081636 | 8/2006 |

OTHER PUBLICATIONS

International Search Report, PCT International Application No. PCT/EP2007/058684, dated Dec. 3, 2007.

* cited by examiner

*Primary Examiner*—Thanh V Pham
(74) *Attorney, Agent, or Firm*—Kenyon & Kenyon LLP

(57) ABSTRACT

A capping technology is provided in which, despite the fact that structures which are surrounded by a silicon-germanium filling layer are exposed using $ClF_3$ etching through micropores in the silicon cap, an etching attack on the silicon cap is prevented, namely, either by particularly selective (approximately 10,000:1 or higher) adjustment of the etching process itself, or by using the finding that the oxide of a germanium-rich layer, in contrast to oxidized porous silicon, is not stable but instead may be easily dissolved, to protect the silicon cap.

10 Claims, 3 Drawing Sheets

METHOD FOR PRODUCING A MICROMECHANICAL COMPONENT HAVING A THIN-LAYER CAPPING

FIELD OF THE INVENTION

The present invention relates to a method for producing a micromechanical component having a cap layer made of silicon.

BACKGROUND INFORMATION

Capping of sensitive micromechanical sensor elements is typically performed by bonding/gluing a cap wafer to the completely processed sensor wafer. In order to include a defined atmosphere or a defined pressure, this process step must be carried out under the same conditions. The cap wafer is pre-structured, usually by KOH etching, to ensure the movability of the sensor structures. One of the problems with this complicated process is that when the capping is applied the sensor structures are freely movable, and therefore are extremely sensitive to impact and particle contamination.

One conventional capping, thin-layer capping technology, omits a cap wafer, and instead provides a cavity between the micromechanical structures to be exposed and a silicon layer (cap layer), which is produced using a customary deposition process. This method is based on the removal of a filling layer, situated beneath an existing silicon (Si) cap layer, by etching to produce the cavity. To feed the etching gas into the filling layer, a perforation is usually provided in the cap layer which is later resealed, after the filling. layer and optionally other sacrificial layers have been etched away, by depositing a sealing layer. However, introduction of etching gas through the Si cap layer requires fairly complicated measures to prevent the etching gas from also attacking the Si cap layer.

In this respect, a thin-layer capping (fill poly) technology is described in German Patent Application No. DE 100 06 035 A1, in which the Si cap layer is provided with a perforation composed of trenches which are produced using a conventional deep-etching process. To allow the fill epipoly Si layer to be etched by the etching gas $ClF_3$ in a selective manner with respect to the Si cap layer, side wall passivation of the trenches, as well as further protective layers, are provided.

German Patent Application No. DE 10 2004 036 803 A1 discloses an etching method which may be used for thin-layer capping, in which a very high desired selectivity of approximately 4000:1 with respect to polysilicon may be achieved using $ClF_3$ as the etchant in combination with a (filling) layer composed of a silicon-germanium ($Si_{1-x}Ge_x$) alloy which is to be removed. In conjunction with the production of a poly-Si cap layer, this selectivity is sufficient to channel the etching gas, without attacking the cap, through trenches conventionally produced in the cap layer using a masking technique. However, as mentioned in the cited German patent application, sealing of these relatively large trenches or openings in the cap (in the micrometer range) requires a sealing layer having a relatively large thickness of approximately 1 μm to 20 μm. For such thick sealing layers, however, there is always the risk that the exposed micromechanical structures beneath the large openings may be inadvertently coated as well. On the other hand, there is a concern that for porosified cap silicon, having openings in the nanometer range, the selectivity available in the known method is not high enough to prevent the etching gas from attacking the porous Si material, which is present in the form of small grains.

A method is described in German Patent Application No. DE 199 61 578 A1 in which the Si cap is provided with micropores. An oxide based on silicon is used as a conventional filling or sacrificial layer, and is etched away using HF vapor etching, a process which has sufficient selectivity with respect to the cap silicon, but is relatively slow.

SUMMARY

An object of the present invention is to provide an improved thin-layer capping technology.

In a first example approach according to the present invention, a silicon-germanium (SiGe) filling layer is deposited on a substrate, a silicon cap layer is deposited on the SiGe filling layer, micropores having a diameter in the nanometer range are produced in the Si cap layer, thereby producing a porous Si cap layer, and the SiGe filling layer is removed by gas phase etching using $ClF_3$ introduced through the micropores, the $ClF_3$ etching parameters and the $Si_{1-x}Ge_x$ composition of the filling layer being adjusted in such a way that the selectivity with respect to the porous Si cap layer is sufficiently high to prevent attack of the Si cap layer. The micropores are then sealed by depositing a sealing layer on the porous Si cap layer.

In a second example approach according to the present invention, an SiGe filling layer is deposited on a substrate and a germanium (Ge)-rich layer is provided, which is formed either by an upwardly increasing germanium concentration gradient in the SiGe filling layer itself or by depositing an additional germanium (Ge) layer on the SiGe filling layer, then a Si cap layer is deposited on the Ge-rich layer, and subsequently micropores having a diameter in the nanometer range are produced in the Si cap layer and in the Ge-rich layer, thereby producing porous layers, followed by thermal oxidization of the porous layers, and then the oxide in the porous Ge-rich layer is removed using an oxide dissolution process, and the SiGe filling layer and the Ge-rich layer are removed by gas phase etching using $ClF_3$ introduced through the micropores. Lastly, the micropores are sealed by depositing a sealing layer on the porous Si cap layer.

The basic concept is the provision of a thin-layer capping technology in which, despite the fact that sensor structures which are surrounded by an SiGe (sacrificial) filling layer are exposed by $ClF_3$ etching through small pores in the Si capping, and despite the advantages associated with this operating process, an etching attack on the Si cap is prevented in a manner which is technically not very complicated, namely, either by particularly selective (approximately 10,000:1 or higher) adjustment of the etching process itself or by using the finding that the oxide of a germanium-rich layer in contrast to oxidized porous Si is not stable but instead may be easily dissolved, in the stated manner according to the present invention.

The general advantages of thin-layer technology may be realized using the example method according to the present invention. In other words, no bonding processes or cap wafers are necessary. The capping is directly integrated on the sensor structures. The volume of the sensor element is reduced as a result of the low height of a maximum of several 10 μm.

According to one specific example embodiment of the second approach according to the present invention, it is advantageous for the Ge-rich layer to have a thickness of only approximately 30 nm to 100 nm. In addition, the thermal oxidation may advantageously be carried out at temperatures of approximately 200 to 400 degrees Celsius, so that there is no thermal damage to the SiGe or Ge-rich layer. The possibility of easily dissolving the oxide contained in the Ge-rich layer in water or steam is particularly advantageous for all variants of the second approach according to the present invention.

One specific example embodiment of the present invention is considered to be particularly advantageous, in which an SiGe sacrificial layer is applied before the SiGe filling layer is deposited beneath the micromechanical structures to be exposed, and the SiGe sacrificial and filling layers are etched away in one step and the structures are exposed.

As an alternative, for all variants of the two approaches according to the present invention, it is possible to deposit the SiGe filling layer on micromechanical structures which have already been exposed using a sacrificial layer that is not composed of SiGe.

One particularly advantageous refinement in all variants of the present invention is that the diameters of the micropores are in a range of 2 nm to 20 nm. As a result, the sealing layer may have a very small thickness of approximately 100 nm so that the exposed sensor structures are no longer affected during the sealing of the cap.

These types of fine micropores may also be easily produced by electrochemical etching or by using a currentless stain-etch process.

BRIEF DESCRIPTION OF THE DRAWINGS

FIG. 4 illustrates an enlarged detail from FIG. 3.

DETAILED DESCRIPTION OF EXAMPLE EMBODIMENTS

Figure 1:
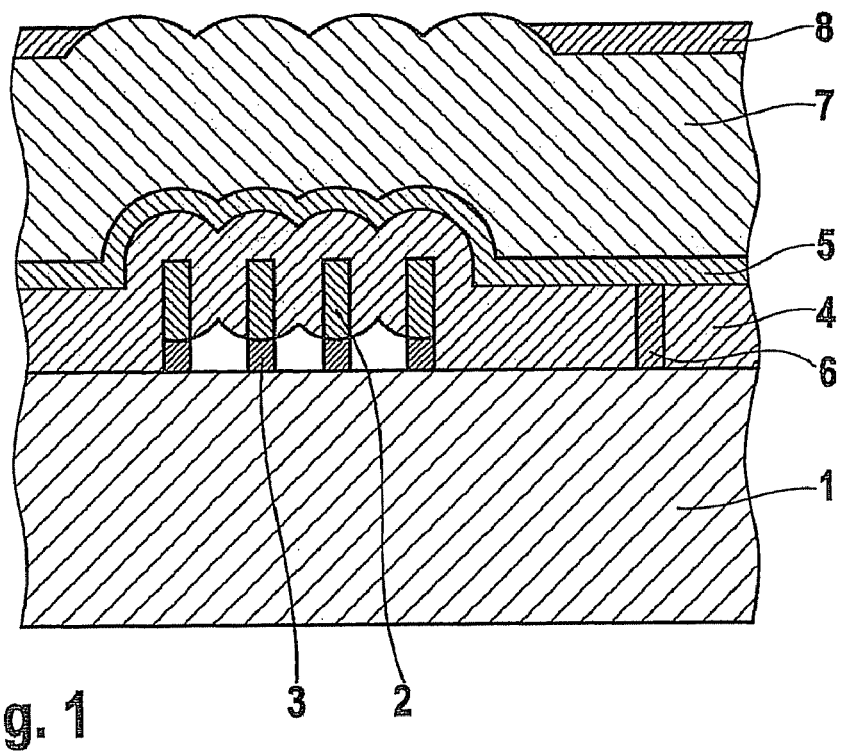
FIGS. 1 through 5, each in a sectional view, show the production method according to the present invention in one exemplary embodiment.

FIG. 1 illustrates a production step in which micromechanical structures 2, for example a comb structure for a rotational speed or acceleration sensor, have already been structured on a silicon substrate 1 but not yet exposed by etching of a sacrificial layer 3, preferably an SiGe-based sacrificial layer, situated beneath structures 2. However, modifications are conceivable, for example using poly-Si sacrificial layers 3, in which structures 2 are to be exposed before the method steps described below.

In any case, sensor structures 2 are then covered by a silicon-germanium (SiGe) filling layer 4. The sensor structures are thus stationary until SiGe sacrificial layer 3 is etched, and therefore are insensitive to mechanical impacts. SiGe filling layer 4 is later removed in a highly selective manner with regard to silicon sensor structures 2, using $ClF_3$ etching, and in this respect is also a sacrificial layer. Poly-Si layer 7 shown in FIG. 1 (several 100 nm to several micrometers thick) is deposited on SiGe filling layer 4. As described in greater detail in the further method steps according to FIGS. 2 through 5, the poly-Si layer is then porosified, and is later used as thin-layer cap 7. First, however, the SiGe in filling layer 4 is preferably p-doped. This is followed by deposition of a thin germanium layer 5 having a thickness of several 10 nm to 100 nm, which is likewise p-doped (see FIG. 1). Alternatively, instead of additional Ge layer 5, it is possible to deposit only SiGe filling layer 4 with a Ge concentration gradient, resulting in a Ge-rich (partial) layer 5 in the upper region of the SiGe filling layer, away from the substrate.

It may be necessary to provide an electrical contact 6 to substrate 1 for subsequent pore formation (see FIG. 1). This connection may also be provided via SiGe layer 4 or poly-Si layer 7. The thick, p-doped poly-Si layer 7 previously mentioned is deposited on Ge-rich layer 5. This poly-Si layer represents subsequent cap 7.

Figure 2:
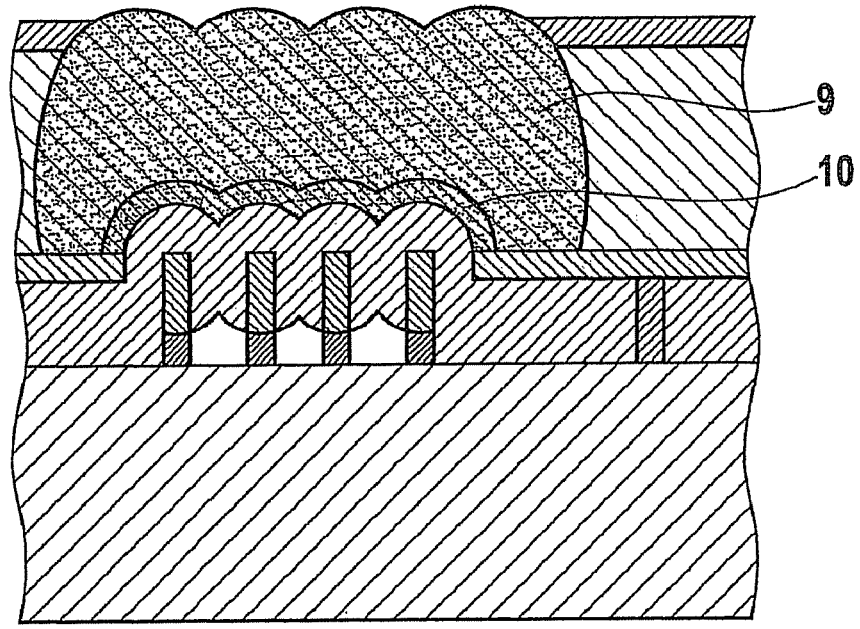

Poly-Si layer 7 and Ge-rich layer 5 are porosified in places, using electrochemical etching in hydrofluoric acid (HF), resulting in the state having porous layers 9 and 10 illustrated in FIG. 2. For this purpose, an etching mask 8 (see FIG. 1) is deposited and structured beforehand. Layers 8 composed of SiN, $Si_3N_4$, or n-dopings are preferably used.

As an alternative to electrochemical etching, a currentless etching process (so-called stain-etch) known as such may be used. In this case, micropore formation is carried out in a mixture of HF and an oxidizing agent ($H_2O_2$, $HNO_3$, for example). Electrical contact 6 to substrate 1 may be omitted in this currentless method.

Figure 3:
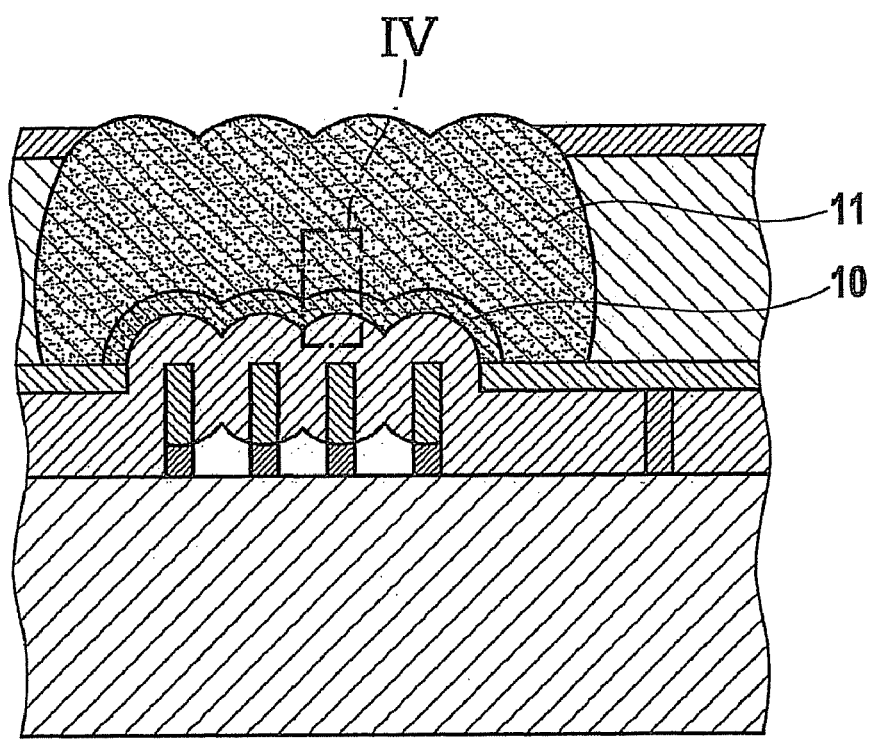
Figure 4:
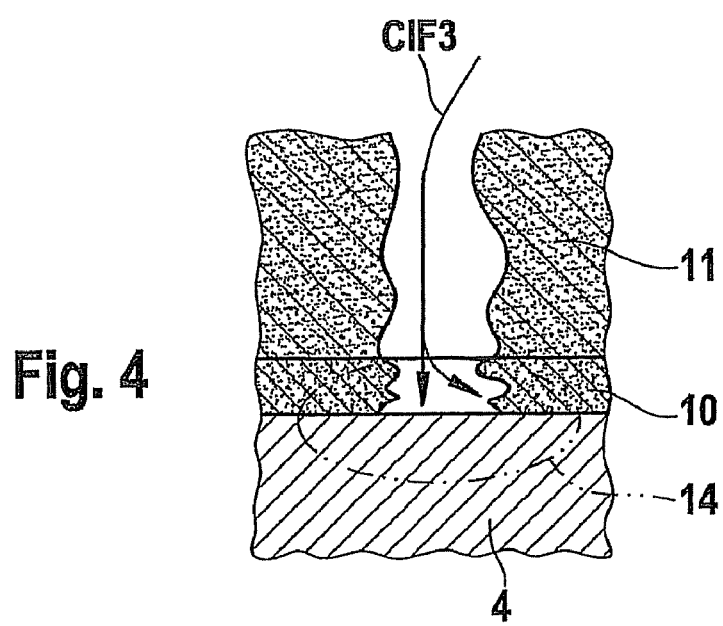

Porous layers 9 and 10 shown in FIG. 2 are then thermally oxidized, resulting in the state according to FIG. 3. This oxidation is preferably carried out at low temperatures of approximately 200° C.-400° C. so that there is no thermal influence on SiGe filling layer 4 or Ge-rich layer 5. In contrast to oxidized porous silicon 11, the oxide in Ge-rich layer 5 is not stable, and may be dissolved in $H_2O$ or $H_2O$ vapor, for example. Oxidized porous silicon 11 then provides access holes for the $ClF_3$ etching process. Access to the area below via porous Ge-rich layer 10, whose oxide film has been removed as described, is ensured. Since oxide is inert in the $ClF_3$ etching process, porous silicon region 11 (later cap 7) is not attacked. Porous Ge-rich layer 10, on the other hand, is quickly removed in $ClF_3$. SiGe filling layer 4 and SiGe sacrificial layer 3 are then etched with $ClF_3$ in one step. These method steps are clarified in an enlarged section in FIG. 4, in which region 14 indicates the etching attack.

Figure 5:
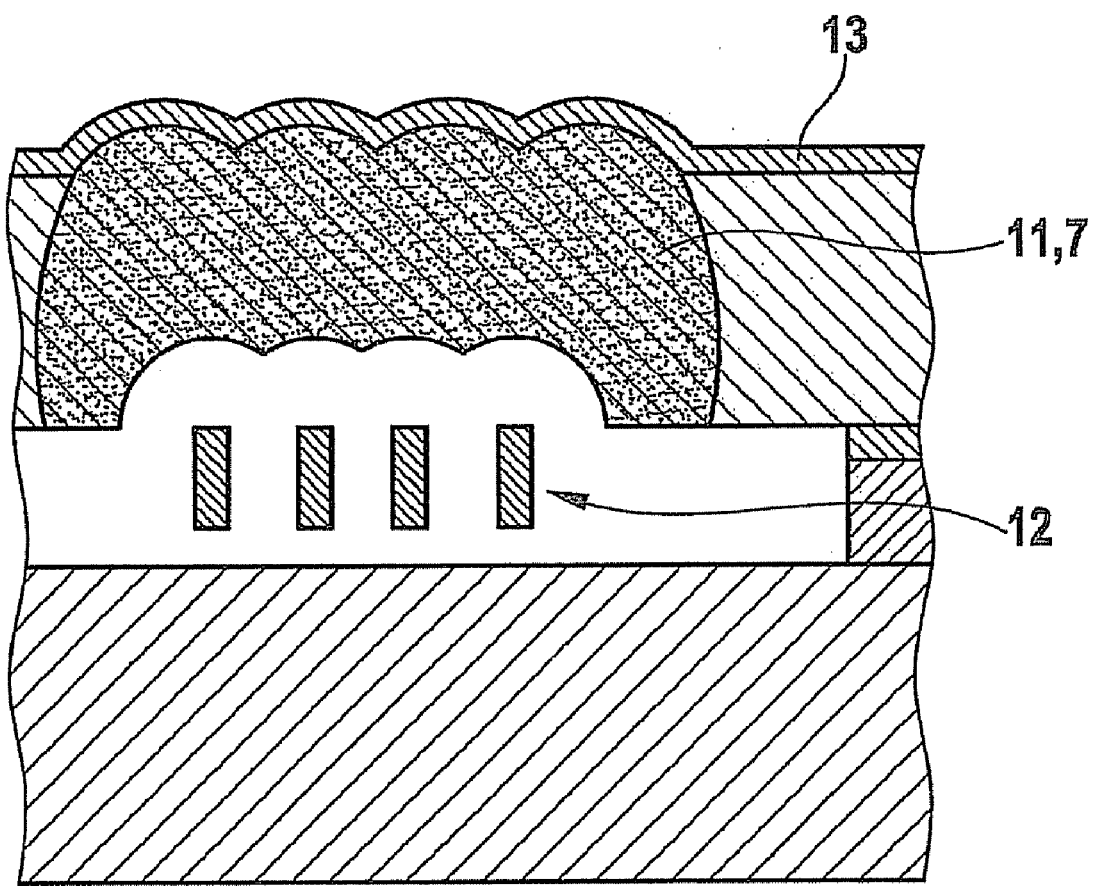

As shown in FIG. 5, exposed sensor structures 12 are produced by the $ClF_3$ etching. When an SiGe sacrificial layer MEMS process is used, filling layer 4 and sacrificial layer 3 are removed in one step. However, as previously mentioned, it is also possible to use this method to cap MEMS processes without an SiGe sacrificial layer 3; in this case the previously exposed sensor structures 12 are covered by SiGe filling layer 4. The further sequence corresponds to that described above.

By suitable selection of the $ClF_3$ etching parameters and the SiGe composition, i.e., the particular Si or Ge proportion, it is possible to set a correspondingly high selectivity between the SiGe filling layer and the etching of the porosified Si in $ClF_3$ without using a Ge-rich layer 5 so that oxidation may even be completely omitted. This greatly simplifies the process since the oxide dissolution process is also omitted.

Lastly, according to FIG. 5, porous cap 7 or 11 is sealed by depositing a thin sealing layer 13. The openings, i.e., micropores, in this cap 7 have a diameter in the range of 2 nm-20 nm, in particular less than 5 nm, and may therefore be sealed using sealing layers 13 having a thickness of approximately 100 nm, which is sufficient for a reliable seal, without also coating underlying sensor structure 12. A process vacuum or defined process atmosphere may be included in the seal, depending on the deposition method.

In addition, before the capping an anti-stiction coating (ASC) layer may be deposited through porous silicon 7, 11 and onto exposed MEMS structures 12. The example method according to the present invention may be used for all silicon-based sensors which require capping.

What is claimed is:

1. A method for producing a micromechanical component having a cap layer made of silicon, comprising:
   depositing a silicon-germanium filling layer on a substrate;
   depositing a silicon cap layer on the silicon-germanium filling layer;

producing micropores, having a diameter in the nanometer range, in the silicon cap layer, thereby producing a porous silicon cap layer;

removing the silicon-germanium filling layer by gas phase etching using $ClF_3$ introduced through the micropores, $ClF_3$ etching parameters and a $Si_{1-x}Ge_x$ composition of the filling layer being adjusted in such a way that selectivity with respect to the porous silicon cap layer is sufficiently high to prevent attack of the silicon cap layer; and sealing the micropores by depositing a sealing layer on the porous silicon cap layer.

2. A method for producing a micromechanical component having a cap layer made of silicon, comprising:

depositing a silicon-germanium filling layer on a substrate and providing a germanium-rich layer, which is formed one of: i) by an upwardly increasing germanium concentration gradient in the silicon-germanium filling layer, or ii) by depositing an additional germanium layer on the silicon-germanium filling layer;

depositing a silicon cap layer on the germanium-rich layer;

producing micropores, having a diameter in the nanometer range, in the silicon cap layer and in the germanium-rich layer, thereby producing porous layers;

thermally oxidizing the porous layers and then removing an oxide in the porous germanium-rich layer using an oxide dissolution process;

removing the silicon-germanium filling layer and the germanium-rich layer by gas phase etching using $ClF_3$ introduced through the micropores; and sealing the micropores by depositing a sealing layer on the porous silicon cap layer.

3. The method as recited in claim 2, wherein the germanium-rich layer has a thickness of approximately 30 nm to 100 nm.

4. The method as recited in claim 2, wherein the thermal oxidation is carried out at temperatures of approximately 200 to 400 degrees Celsius.

5. The method as recited in claim 2, wherein the oxide in the germanium-rich layer is dissolved in water or steam.

6. The method as recited in claim 1, wherein a silicon-germanium sacrificial layer is applied before the silicon-germanium filling layer is deposited beneath the micromechanical structures to be exposed, and the silicon-germanium sacrificial and filling layers are etched away in one step and the structures are exposed.

7. The method as recited in claim 1, wherein the silicon-germanium filling layer is deposited on micromechanical structures which have already been exposed using a sacrificial layer that is not composed of silicon-germanium.

8. The method as recited in claim 1, wherein the diameters of the micropores are in a range of 2 nm to 20 nm.

9. The method as recited in claim 8, wherein the sealing layer has a thickness of approximately 100 nm.

10. The method as recited in claim 1, wherein the micropores are produced by one of i) electrochemical etching, or ii) using a currentless stain-etch process.

* * * * *